United States Patent
Sasaoka et al.

(10) Patent No.: US 6,333,854 B1
(45) Date of Patent: Dec. 25, 2001

(54) MEMORY CARD

(75) Inventors: Chiharu Sasaoka; Koichi Kiryu, both of Iiyama; Hideo Miyazawa, Tokyo, all of (JP)

(73) Assignee: Fujitsu Takamisawa Component Limited, Tokyo (JP)

( * ) Notice: Subject to any disclaimer, the term of this patent is extended or adjusted under 35 U.S.C. 154(b) by 0 days.

(21) Appl. No.: 09/187,734

(22) Filed: Nov. 9, 1998

(30) Foreign Application Priority Data

Nov. 10, 1997 (JP) .................................................. 9-307567

(51) Int. Cl.[7] ...................................................... H05K 1/14
(52) U.S. Cl. ......................... 361/737; 361/736; 361/801; 361/802; 235/429; 439/76.1; 439/136; 439/137
(58) Field of Search ..................................... 361/736, 737, 361/752, 753, 756, 759, 801, 802; 235/492; 439/136, 137, 140, 188, 325, 260, 928.1, 76.1, 326

(56) References Cited

U.S. PATENT DOCUMENTS

| | | | |
|---|---|---|---|
| 4,780,793 | * 10/1988 | Ohtsuki | 361/759 |
| 4,868,714 | * 9/1989 | Banjo et al. | 361/736 |
| 4,887,188 | * 12/1989 | Yoshida et al. | 361/785 |
| 4,926,034 | * 5/1990 | Banjo et al. | 235/492 |
| 5,129,594 | * 7/1992 | Pease | 244/1 R |
| 5,282,113 | * 1/1994 | Kohama et al. | 361/737 |
| 5,397,857 | 3/1995 | Farquhar et al. | 361/684 |
| 5,408,386 | * 4/1995 | Ringer et al. | 361/785 |
| 5,924,782 | * 7/1999 | Park | 312/328 |
| 6,102,715 | * 8/2000 | Centofante | 439/140 |
| 6,109,931 | * 8/2000 | Yotsutani | 439/76.1 |

* cited by examiner

Primary Examiner—Jeffrey Gaffin
Assistant Examiner—Tuan Dinh
(74) Attorney, Agent, or Firm—Staas & Halsey LLP

(57) ABSTRACT

A memory card including a circuit board and a card-shaped hollow casing for accommodating the circuit board. The hollow casing includes an envelope-shaped support member having an integrally molded structure, an opening being defined at a longitudinal end of the support member for insertion of the circuit board into the support member, and a lid member fixed onto the longitudinal end of the support member to close the opening. The support member cooperates with the lid member to securely support the circuit board in the casing. The support member includes an envelope-shaped receptacle defined inside the support member for receiving a major part of the circuit board. The support member also includes a guide portion for directing the circuit board to a proper position within the support member.

10 Claims, 8 Drawing Sheets

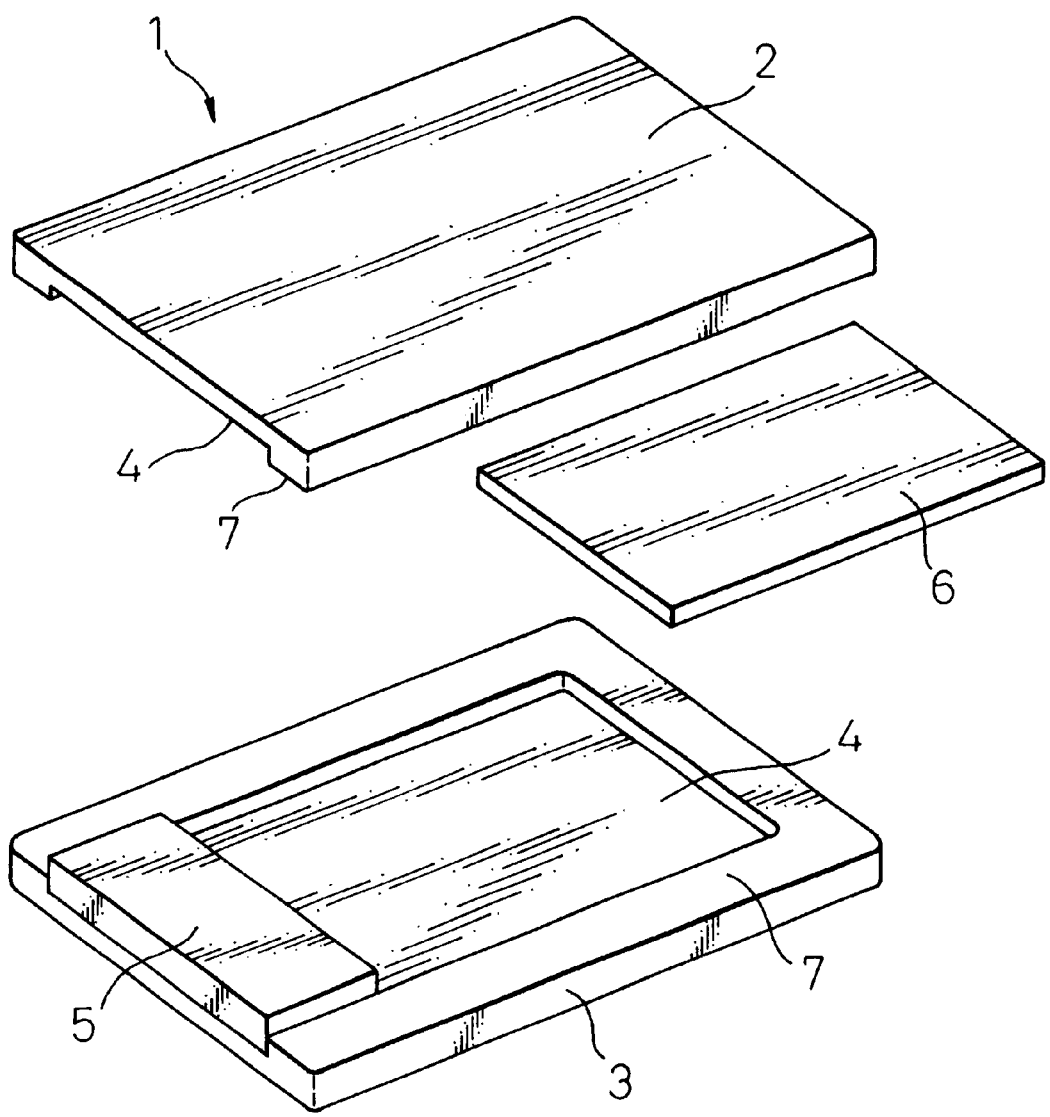

MEMORY CARD

BACKGROUND OF THE INVENTION

1. Field of the Invention

The present invention relates to an auxiliary memory device for electronic devices and, particularly, to a small-sized detachable memory card suitably used for portable electronic devices such as digital cameras or others.

2. Description of the Related Art

Conventionally, as an auxiliary memory device used for portable electronic devices such as digital cameras or others, a small-sized memory card capable of being detachably mounted to the bodies of the electronic devices has been known in the art. This type of memory card, which may be referred to as a flash memory, is structured by assembling a card-shaped hollow casing generally made of resin or metal, a circuit board carrying electronic parts thereon and a connector for forming terminals on the circuit board, the circuit board and the connector being incorporated within the casing.

A typical conventional memory card (i.e., a flash memory) is diagrammatically illustrated in FIG. 9, and includes a card-shaped hollow casing 1 which is divided into two halves generally at a center of a card thickness. Each of the two halves 2 and 3 of the casing 1 has, on a surface 4 thereof confronting the surface 4 of the other half, a section for securely arranging a connector 5 and a section for receiving a circuit board 6 carrying electronic parts (not shown) on the major surface thereof. The two halves 2 and 3 are fixed to each other and the connector 5 and the circuit board 6 are accommodated therein. Each half 2, 3 also includes a rib 7 which is formed to project along an outer peripheral edge region of the surface 4. The end face of the rib 7 of one half 2 is firmly fixed to the end face of the rib 7 of the other half 3 by a well-known fixing means such as ultrasonic welding.

In general, the circuit board 6 is mechanically and stably supported in the casing 1 by the connection of conductor ends (not shown) of the circuit board with the connector 5. The conventional memory card includes such a laminated casing structure, and thus is provided with mechanical protection and electrical insulation properties for the electronic parts on the circuit board 6 as well as a desired level of rigidity of the entire structure of the memory card.

Recently, it has been required, for portable electronic devices, to have multiple functions and high performance, as well as to further reduce the size and weight of the body of the electronic devices. To satisfy such requirements, it has been also contemplated that the dimension of the memory card used as an auxiliary memory device is further reduced. Under such circumstances, the conventional memory card having a laminated casing structure may be deteriorated in the rigidity of the entire structure of the memory card due to the reduction of card size, particularly in the rigidity or durability against a destruction which may be caused, at the rib end faces fixed with each other, to the two halves of the card casing when the casing is twisted.

In order to prevent such a deterioration of rigidity, it is necessary to provide a sufficiently wide fixing area on the rib end face of each casing half, which may restrict the size reduction of the casing. That is, even if the circuit board is miniaturized to a minimum dimension while meeting the functional requirement thereof, the outside dimension of the casing (particularly, a two-dimensional size defined parallel to the major surface of the circuit board) tends to become considerably large, relative to the circuit board size, due to the wide fixing area of the rib end face of each casing half.

SUMMARY OF THE INVENTION

It is, therefore, an object of the present invention to provide a memory card used as an auxiliary memory device of portable electronic devices, which permits the outside dimension of a card casing to be reduced while maintaining the mechanical and electrical performance of the memory card.

It is another object of the present invention to provide a memory card, as an auxiliary memory device, wherein the difference between the outside dimensions of a card casing and of a circuit board accommodated in the casing is minimized, without deteriorating the rigidity of the entire structure of memory card and the protection for the circuit board.

In order to achieve the above objects, the present invention provides a memory card comprising a circuit board; and a hollow casing for accommodating the circuit board; the hollow casing including: an envelope-shaped support member having an integrally molded structure, an opening being defined at an end of the support member for insertion of the circuit board into the support member; and a lid member fixed onto the end of the support member to close the opening; the support member cooperating with the lid member to securely support the circuit board in the casing.

In the above memory card, it is preferred that the support member includes an envelope-shaped receptacle defined inside the support member for receiving a major part of the circuit board.

Also, it is advantageous that the support member includes a guide portion for directing the circuit board to a proper position within the support member.

The guide portion may include a groove recessed in an inner wall surface of the support member to be engaged with an outer periphery of the circuit board.

In this arrangement, the support member may include opposed side walls, and the groove may be provided on each of the side walls.

In the preferred aspect of the invention, the lid member includes an inner surface adapted to be abutted to the circuit board when the lid member is fixed to the support member, the inner surface cooperating with an inner surface of the support member to securely support the circuit board in the casing.

In this arrangement, the inner surface of the lid member may be a slanted surface abutted to an edge of the circuit board.

Also, in the preferred aspect of the invention, the support member is provided with a plurality of slits penetrating through a wall of the support member, and the circuit board is provided on a major surface thereof with a plurality of conductors, the conductors being respectively aligned with the slits when the circuit board is located at a proper position inside the support member.

In this arrangement, the slits may be formed in an outer peripheral region of the support member.

BRIEF DESCRIPTION OF THE DRAWINGS

The above and other objects, features and advantages of the present invention will become more apparent from the following description of preferred embodiments in connection with the accompanying drawings, in which:

FIG. 9 is an exploded perspective view of a conventional memory card.

DETAILED DESCRIPTION OF THE PREFERRED EMBODIMENTS

Figure 1:
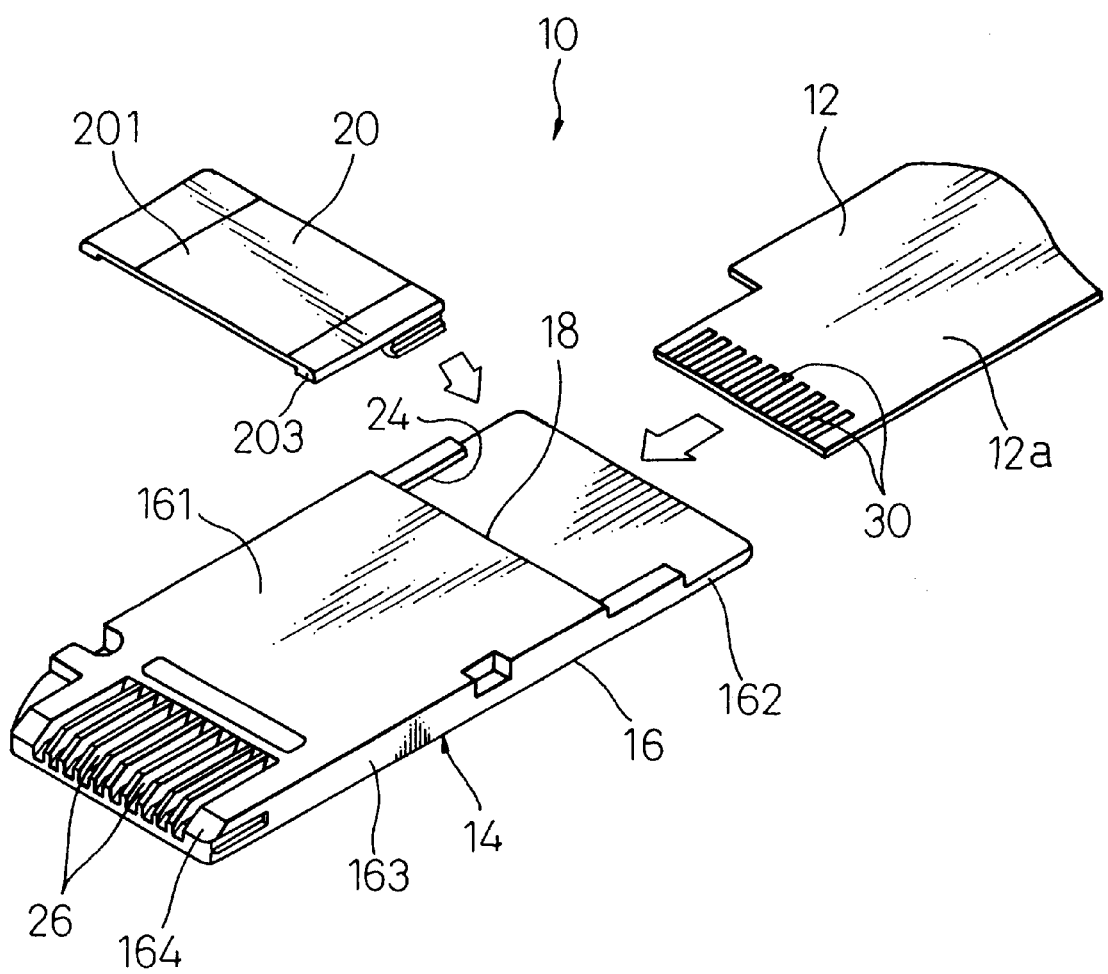
FIG. 1 is an exploded perspective view of one embodiment of a memory card according to the present invention.

Referring now to the drawings, wherein the same or similar components are designated by the same reference numerals, FIGS. 1 to 7 show one embodiment of a memory card according to the present invention.

Figure 2:
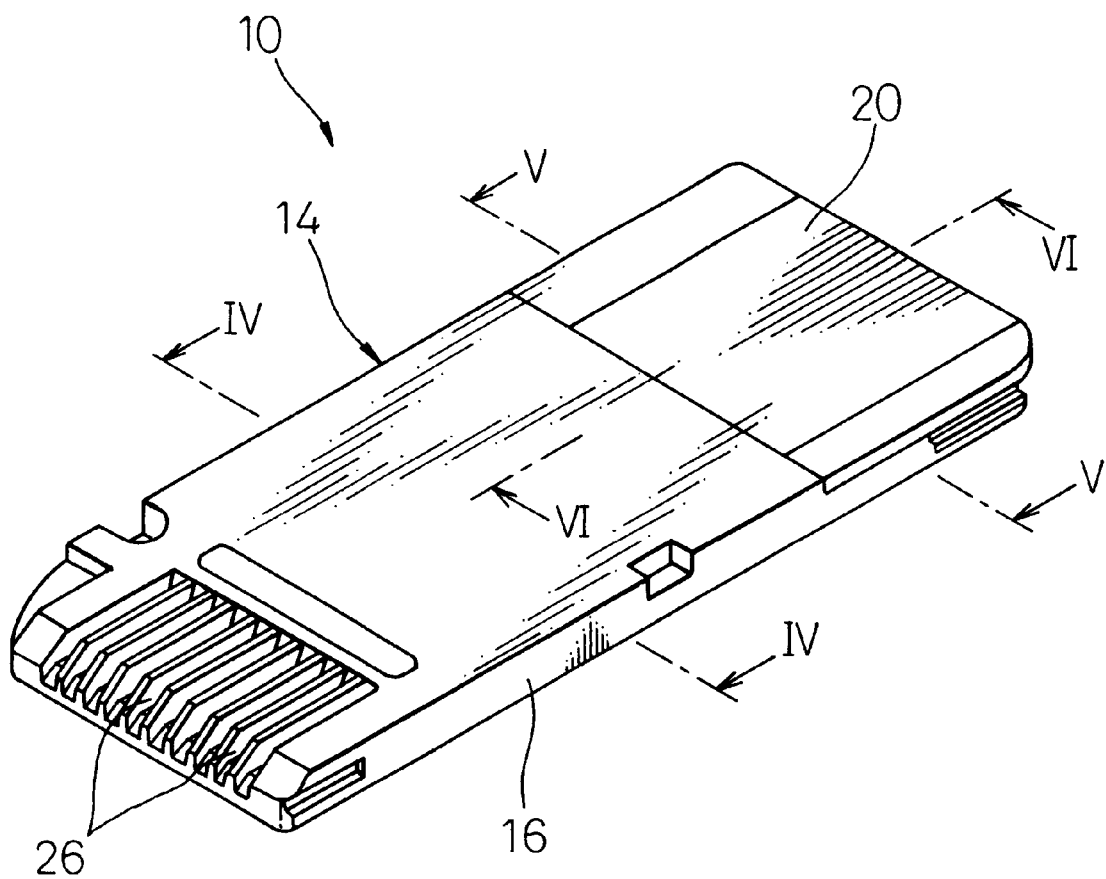
FIG. 2 is a perspective view showing an assembled state of the memory card of FIG. 1.

As shown in FIGS. 1 and 2, the memory card 10 of this embodiment includes a circuit board 12 having a major surface 12a on which electronic parts (not shown) are mounted, and a card-shaped hollow casing 14 securely accommodating the circuit board 12 therewithin. The casing 14 includes a support member 16 with a generally rectangular envelope shape, and a lid member 20 with a generally flat plate shape to be attached to the support member 16. The support member 16 has an integrally molded structure, and an opening 18 is defined at a first longitudinal end of the support member 16 for the insertion of the circuit board 12 into the support member 16. The lid member 20 is fixed onto the first longitudinal end of the support member 16 to tightly close the opening 18.

The support member 16 has an envelope-shaped receptacle 22 (see FIG. 3) for receiving and substantially encircling a major part of the circuit board 12. An upper wall 161 and a lower wall 162 of the support member 16, each of which has a generally flat shape, are arranged parallel to each other, and a pair of side walls 163 of the support member 16 are arranged parallel to each other and generally perpendicular to the upper and lower walls 161 and 162, to define the receptacle 22. The lower wall 162 of the support member 16 is longer than the upper wall 161 of the latter, and extends outward from the opening 18 beyond the edge of the upper wall 161 which defines the opening 18. Both side walls 163 extend to an intermediate position on the extending portion or extension of the lower wall 162.

Figure 3:
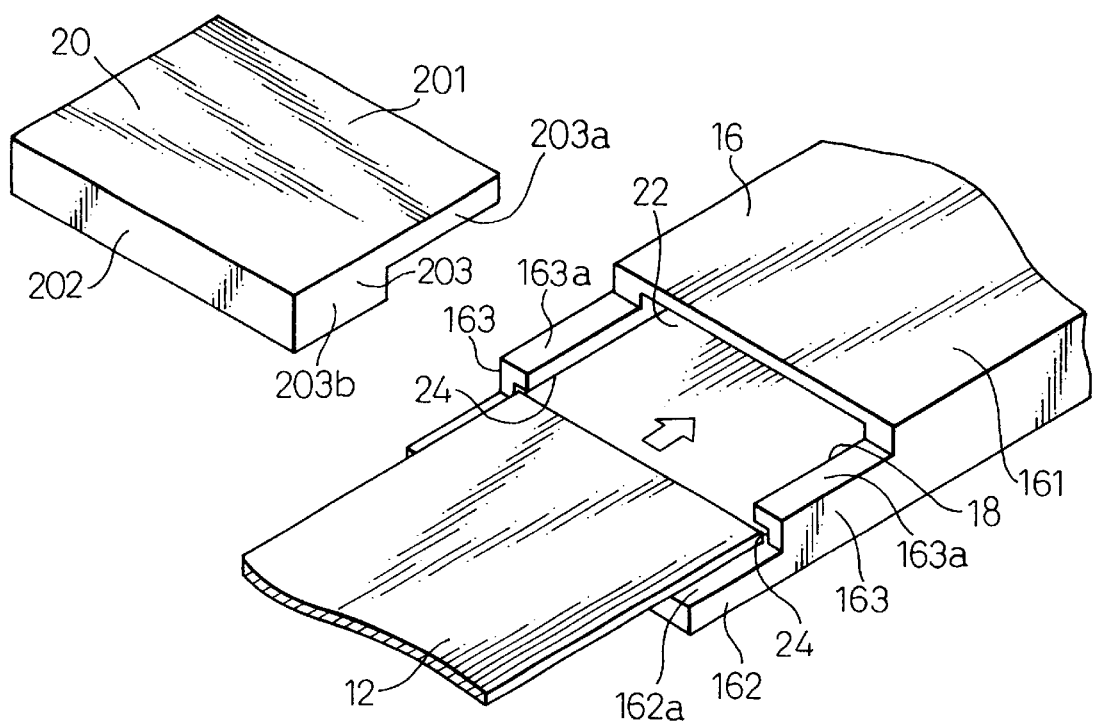
FIG. 3 is an enlarged exploded perspective view of a part of the memory card of FIG. 1, showing the opening side of a support member of a casing.
Figure 4:
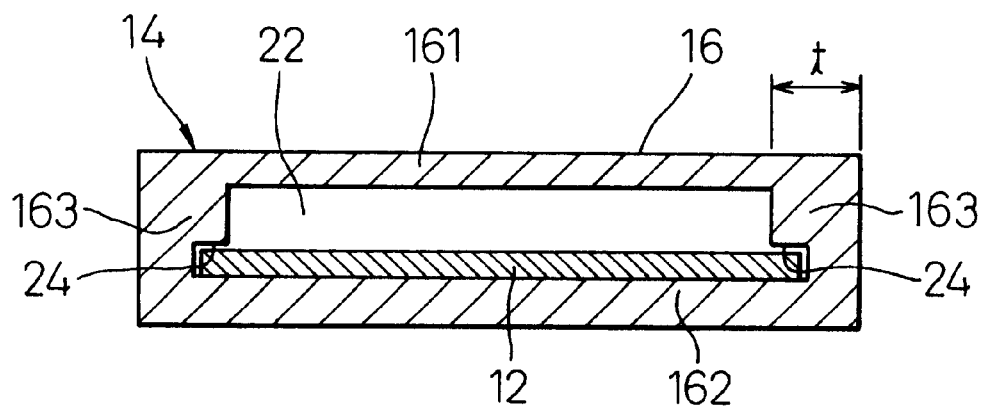
FIG. 4 is a sectional view of the memory card, taken along a line IV—IV in FIG. 2.
Figure 5:
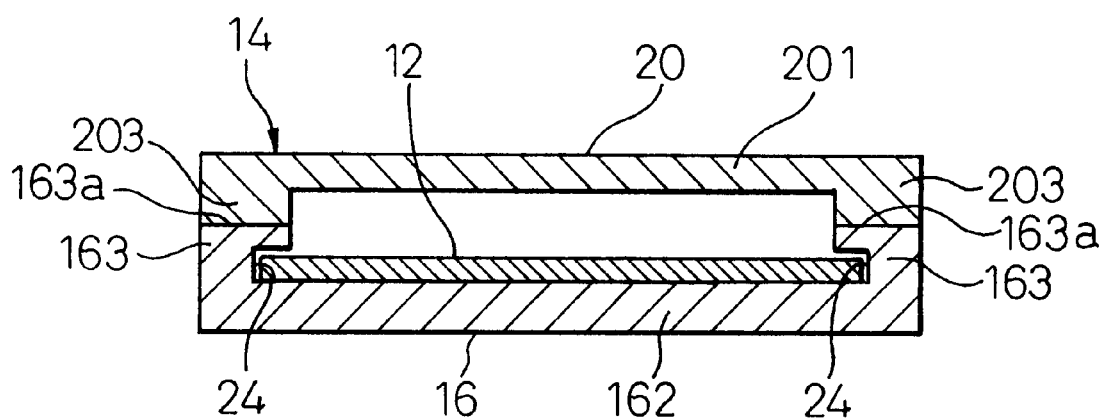
FIG. 5 is a sectional view of the memory card, taken along a line V—V in FIG. 2.
Figure 6:
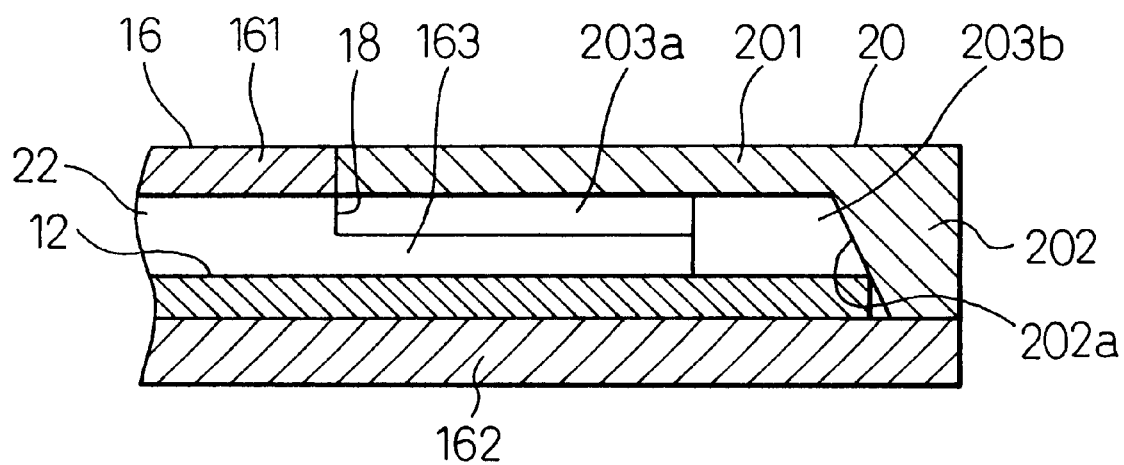
FIG. 6 is a sectional view of the memory card, taken along a line VI—VI in FIG. 2.

As clearly shown in FIGS. 3 and 4, a pair of grooves 24 are provided respectively on the opposed inner surfaces of the side walls 163 of the support member 16, and linearly extend parallel to the lower wall 162 and adjacent to the latter. The circuit board 12 is fitted or engaged on the outer peripheral edge thereof into the grooves 24 of the side walls 163 of the support member 16, and thereby the circuit board 12 is guided to a predetermined position in the receptacle 22 along the grooves 24.

The lid member 20 preferably has an integrally molded structure, and includes a top wall 201 adapted to be arranged generally parallel to and spaced from the extension of the lower wall 162 of the support member 16, a rear end wall 202 adapted to contact a laterally extending edge region of the extension of the lower wall 162, and a pair of side walls 203 adapted to contact longitudinally extending edge regions of the extension of the lower wall 162 and the extending portions or extensions of the side walls 163. The lid member 20 is preferably brought into tight contact with the support member 16 to close the opening 18, so as to form substantially a flush outer surface on the outer surfaces of the lid member 20 and the support member 16 (see FIGS. 2 and 5).

Each side wall 203 of the lid member 20 includes a relatively thicker section 203a projecting relatively little from the top wall 201, to contact face-to-face with a top surface 163a of the extension of each side wall 163 of the support member 16, and a relatively thinner section 203b projecting relatively far from the top wall 201, to contact face-to-face with a top surface 162a of the extension of the lower wall 162 of the support member 16 (see FIG. 3). The rear end wall 202 of the lid member 20 projects from the top wall 201 while gradually decreasing in thickness, to contact face-to-face with the top surface 162a of the extension of the lower wall 162 of the support member 16. Accordingly, the rear end wall 202 is provided with a slanted surface 202a adapted to face the opening 18 of the support member 16 (see FIG. 6).

The lid member 20 and the support member 16 are rigidly fixed to each other, by means of a well-known fixing means such as ultrasonic welding or others, between the top surfaces of the sections 203a of the side walls 203 of the lid member 20 and the top surfaces 163a of the extensions of the side walls 163 of the support member 16, between the top surfaces of the sections 203b of the side walls 203 of the lid member 20 and the top surface 162a of the extension of the lower wall 162 of the support member 16, and between the top surface of the rear end wall 202 of the lid member 20 and the top surface 162a of the lower wall 162 of the support member 16.

As shown in FIG. 3, when the circuit board 12 is inserted into the receptacle 22 through the opening 18, the outer peripheral edge of the circuit board 12 is fitted in the grooves 24 from the front ends of the side walls 163 of the support member 16, and the circuit board 12 is directed along the grooves 24 to a predetermined position in the receptacle 22. Inside the receptacle 22, a space sufficient to accommodate the electronic parts (not shown) mounted on the major surface of the circuit board 12 is defined between the upper wall 161 of the support member 16 and the circuit board 12 (see FIG. 4).

When the circuit board 12 is fully located at the predetermined position in the receptacle 22, a rear edge of the circuit board 12, as defined by the inserting direction thereof, is disposed to project from the side walls 163 on the extension of the lower wall 162 of the support member 16. In this state, when the lid member 20 is properly fixed to the first longitudinal end of the support member 16, the slanted surface 202a of the rear end wall 202 of the lid member 20 is abutted to the rear edge of the circuit board 12 (see FIG. 6). As a result, the circuit board 12 is securely held at the predetermined position in the receptacle 22 by the cooperation of the slanted surface 202a of the rear end wall 202 of the lid member 20 with the respective inner surfaces of the lower wall 162, the grooves 24 in the side walls 163 and a front wall 164 (described later) of the support member 16.

Figure 7:
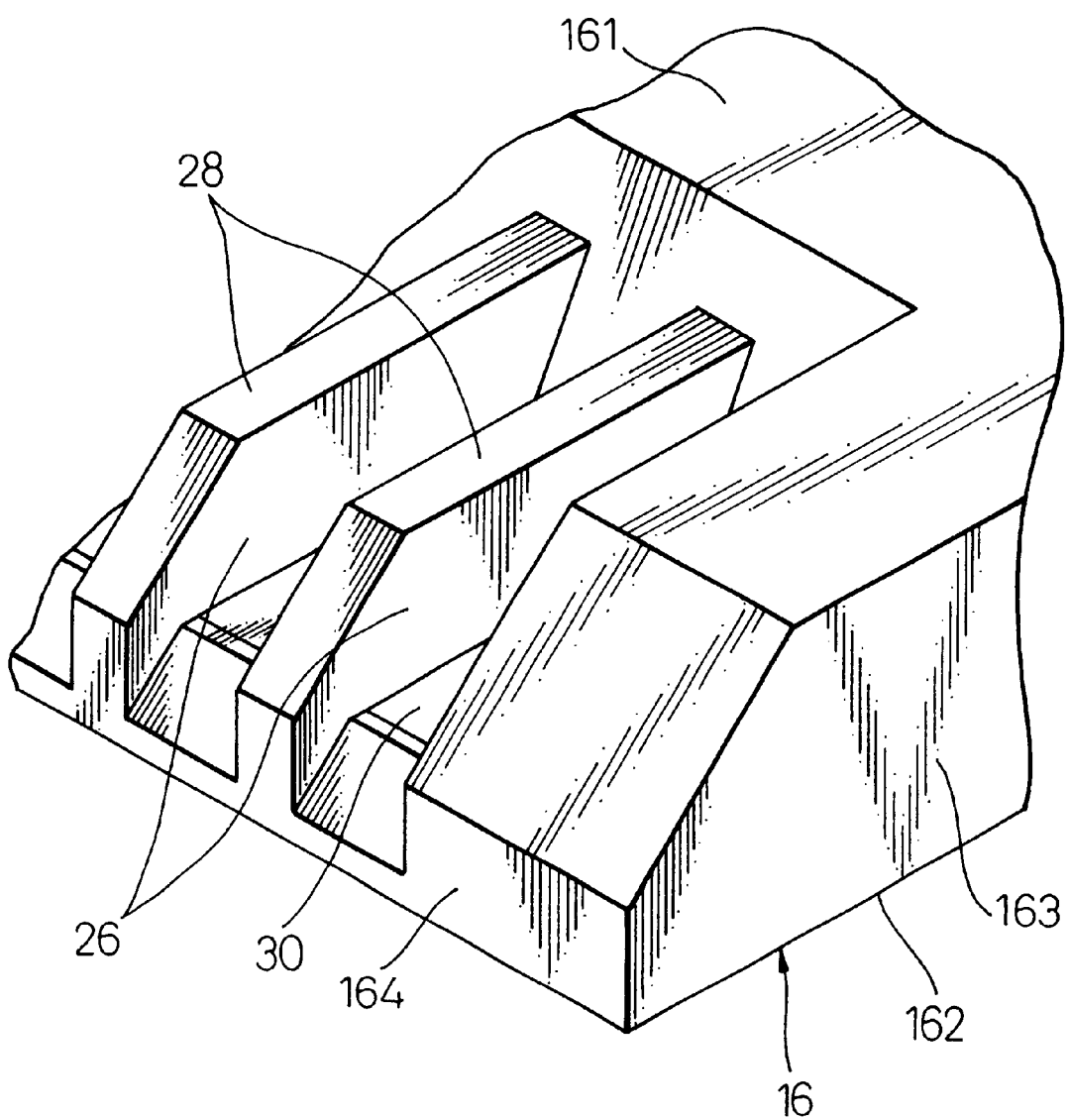
FIG. 7 is an enlarged perspective view of a part of the memory card of FIG. 1, showing the slit side of the support member of the casing.

As shown in FIG. 7, a plurality of slits 26 are formed in the upper and front walls 161, 164 defining the receptacle 22, at a second longitudinal end of the support member 16 opposite to the opening 18. The slits 26 are formed generally parallel to each other, and penetrate through the upper and lower wall 161, 162 generally perpendicular thereto, to permit the receptacle 22 of the support member 16 to be accessed from the outside of the casing 14. Between the side-by-side slits 26, a partition wall 28 is formed generally vertical to the upper and lower walls 161, 162.

When the circuit board 12 is located at the predetermined position inside the receptacle 22 as described above, the front end of the circuit board 12, i.e., the leading end thereof as defined by the inserting direction, is abutted to the inner surface of the front wall 164 of the support member 16. In this state, a plurality of conductor terminals 30 (FIG. 1) formed on a front end region of the major surface of the circuit board 12 are positioned in respective alignment with the slits 26 of the support member 16. Thus, the conductor terminals 30 of the circuit board 12 are easily accessible through the slits 26 from the outside of the casing 14.

Since the adjacent conductor terminals 30 aligned with the slits 26 are separated from each other by the partition wall 28, it is possible to correctly and stably establish an electrical connection of the conductors of the circuit board 12 with external electrical conductors. Consequently, the slits 26 and the conductor terminals 30 cooperate to act as a connector section of the memory card 10. In this respect, when the memory card 10 is attached to a slot provided in a corresponding electronic devices (not shown), the memory card 10 is inserted into the slot in such a manner that the second longitudinal end of the support member 16 having the slits 26 is a leading end.

To achieve the correct electrical connection between the external conductors and the conductors of the circuit board 12, it is important that the respective conductor terminals 30 are accurately aligned with the respective slits 26 and this state is fixedly maintained. According to the memory card 10, it is possible to readily direct the circuit board 12 into the predetermined position within the receptacle 22 and to quickly and correctly locate the conductor terminals 30 of the circuit board 12 at positions aligned with the slits 26, by such a simple operation that the circuit board 12 is inserted into the receptacle 22 while being engaged with the grooves 24 of the opposite side walls 163 of the support member 16. In addition, since the circuit board 12 is fixedly supported, at a predetermined position in the receptacle 22, by the cooperation of the slanted surface 202a of the rear end wall 202 of the lid member 20 with the respective inner surfaces of the lower wall 16, the side wall grooves 24 and the front wall 164, the conductor terminals 30 are also fixedly supported at the above-identified position.

As described above, the memory card 10 is provided with the slits 26 formed in the outer peripheral region of the casing 14, so that the electrical and mechanical attachment/detachment of the memory card 10 to the electronic devices can be carried out without the provision of a connector section with contacts as a separate part, which has been used in the conventional memory card. As a result it is possible to facilitate the reduction of the size and weight of the memory card, and to lower the manufacturing cost due to the reduction of the number of parts.

In the memory card 10, the card-shaped hollow casing 14 is structured by the support member 16 integrally molded into an envelope shape encircling a major portion of the circuit board 12, and the lid member 20 fixed to the support member 16 to tightly close the opening 18 thereof. Accordingly, contrary to the conventional memory card including a laminated casing as shown in FIG. 9, which requires the wide fixing areas of the rib end faces of casing halves to maintain the sufficient casing rigidity, the memory card 10 does not necessarily need the wide fixing areas between the support member 16 and the lid member 20 to maintain the rigidity of the casing 14. Therefore, it is possible to reduce the outside dimension of the casing 14 while maintaining the mechanical and electrical performance of the memory card 10. More specifically, it is possible to minimize the difference between the outside dimensions of the casing 14 and of the circuit board 12 accommodated therein, without deteriorating the rigidity of the entire structure of memory card 10 and the protection for the circuit board 12.

For example, even if a thickness "t" (FIG. 4) of each side wall 163 of the support member 16 is decreased, as long as the groove 24 can be formed therein, the casing 14 can exert a sufficient rigidity against an external force, particularly an external torsion force applied to the casing 14, due to the integrally molded structure of the support member 16. Alternatively, the side walls 163 may be formed sufficiently thinner only at the grooves 24 and the remainder of the side walls 163 may be formed sufficiently thicker. Also, the integrally molded structure of the support member 16 contributes to the reduction of the thickness of the front wall 164.

Further, since the memory card 10 is structured so that the circuit board 12 accommodated in the casing 14 is fitted, at the outer peripheral region of the circuit board 12, in the grooves 24 formed on the side walls 163 of the support member 16, it is possible to minimize the gaps between the surfaces of the circuit board 12 and of the grooves 24, provided that the insertion of the circuit board 12 is not disturbed. Accordingly, when the external torsion force is applied to the casing 14, the surfaces of the circuit board 12 and of the grooves 24 are engaged with each other, whereby it is possible to effectively restrict the deformation of the support member 16 with the aid of the torsional rigidity of the circuit board 12. In this case, the circuit board 12 may be a printed circuit board including a glass/epoxy substrate.

In this respect, the memory card 10 has also a laminated structure consisting of the mutually fixed support member 16 and lid member 20. However, the rigidity of the entire structure of memory card 10 can easily be enhanced by sufficiently minimizing the lid member 20 relative to the support member 16 so that most of the external torsion force is received by the support member 16.

The casing 14 of the memory card 10 may be made of various materials. For example, a liquid crystal polymer is particularly suitable as the material of the support member 16, from the viewpoint of a good flowability in the molten state, which is favorable for a thin-wall molding, and of productivity for a molded product with a high mechanical strength. The lid member 20 is preferably made of the same material as the support member 16 in consideration of the easy fixing with the support member 16. Also, a metal sheet may be provided on the outer surface of the casing 14 for the electro-magnetic shielding.

Figure 8:
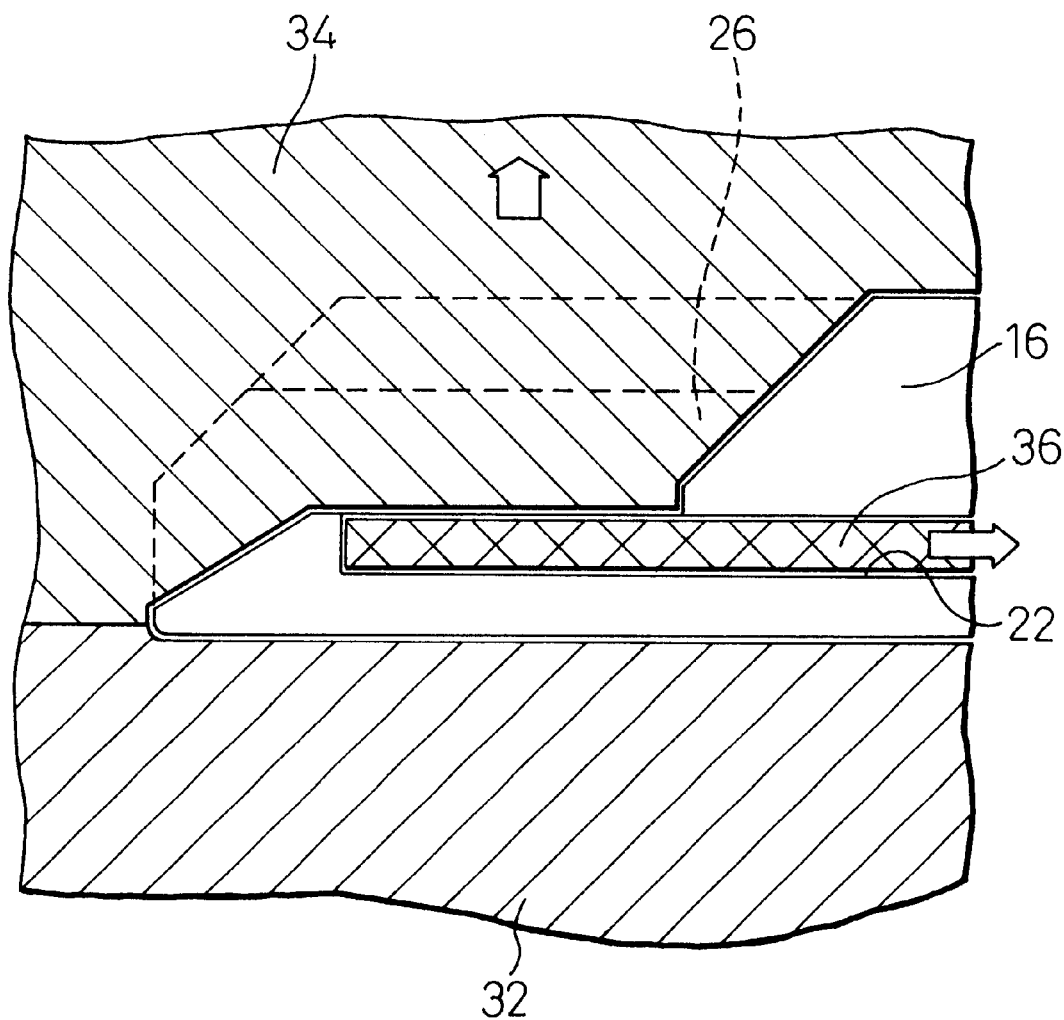
FIG. 8 is a schematically sectional view of a mold used for molding the support member of the casing of the memory card of FIG. 1.

The support member 16 of the memory card 10 may be integrally molded from the liquid crystal polymer by using, for example, a mold as shown in FIG. 8. FIG. 8 partially and diagrammatically shows a lower mold 32, an upper mold 34 and a core 36, to clarify a process for forming the slits 26 in the support member 16. The lower mold 32, upper mold 34 and core 36 are assembled together as illustrated and a molten liquid crystal polymer is injected into a cavity defined therebetween to be solidified in the cavity, so that the support member 16 is integrally molded with the receptacle 22 and the slits 26 being formed therein. After that, the upper mold 34 is removed from the molded support member 16 in the direction shown by an arrow, and the core 36 is slidably displaced in the direction shown by an arrow, whereby the complete support member 16 shown in FIG. 1 is obtained.

As will be understood from the above description, the memory card according to the present invention permits the circuit board to be miniaturized to a minimum dimension while meeting the functional requirement thereof, as well as the outside dimension of the casing to be reduced accordingly while maintaining the rigidity of the memory card. Also, even if the size of the circuit board must be increased to improve the performance thereof, the memory card of the present invention can minimize the increase of the outside dimension of the casing while maintaining the rigidity of the memory card. Consequently, the memory card of the present invention may be particularly useful in portable electronic devices, and may facilitate the reduction of the size and weight of the portable electronic devices while meeting the requirement of multiple functions and high performance of the memory card.

While the invention has been particularly shown and described with reference to preferred embodiments thereof, it will be understood by those skilled in the art that various changes and modifications may be made without departing from the spirit and scope of the invention.

For example, while the circuit board 12 of the memory card 10 includes one major surface for mounting electronic parts thereon and a back surface opposite to the major surface being placed on the lower wall 162 of the support member 16, another type of circuit board may be used, which includes opposed two major surfaces for mounting electronic parts thereon, by forming the grooves 24 at intermediate positions of the heights of the side walls 163 of the support member 16. Also, instead of the lid member 20 of the illustrated embodiments, which is positioned above the upper surface of the rear section of the circuit board 12, it is possible to use another type of lid member which can close a rear end opening defined at the rear end face of the first longitudinal end of the support member 16 (i.e., defined at a position corresponding to the rear end wall 202 of the lid member 20). In this arrangement, the lid member can push the rear end of the circuit board straight into the receptacle when the lid member is attached to the support member to close the opening. Further, the slits 26 penetrating through the wall of the support member 16 may be provided at various positions on the support member 16 with various shapes other than those as illustrated, in accordance with the structures of connector sections of electronic devices onto which the memory card 10 is mounted.

What is claimed is:

1. A memory card comprising:

a circuit board; and a hollow casing for accommodating said circuit board;

said hollow casing including:

an envelope-shaped support member having an integrally molded structure, an opening being defined at an end of said support member for sliding of said circuit board into said support member; and a lid member rigidly fixed onto said end of said support member to close said opening;

said support member cooperating with said lid member to securely support and hold said circuit board at a predetermined position in said casing.

2. The memory card of claim 1, wherein said support member includes an envelope-shaped receptacle defined inside said support member for receiving and encircling a major part of said circuit board.

3. The memory card of claim 1, wherein said support member includes a guide portion for holding said circuit board at said predetermined position within said casing.

4. The memory card of claim 3, wherein said guide portion includes a groove recessed in an inner wall surface of said support member to be engaged with an outer periphery of said circuit board.

5. The memory card of claim 4, wherein said support member includes opposed side walls, and said groove is provided on each of said side walls.

6. The memory card of claim 1, wherein said lid member includes an inner surface abutted to said circuit board, said inner surface cooperating with an inner surface of said support member to securely support and hold said circuit board at said predetermined position in said casing.

7. The memory card of claim 6, wherein said inner surface of said lid member is a slanted surface abutted to an edge of said circuit board.

8. The memory card of claim 1, wherein said support member is provided with a plurality of slits penetrating through a wall of said support member, and wherein said circuit board is provided on a major surface thereof with a plurality of conductors, said conductors being respectively aligned with said slits and securely held in this aligned position by a cooperation of said support member and said lid member.

9. The memory card of claim 8, wherein said slits are formed in an outer peripheral region of said support member.

10. The memory card of claim 2, wherein said support member includes an upper wall, a lower wall and a pair of opposed side walls integrally joined with said upper wall and said lower wall so as to define said envelope-shaped receptacle.

* * * * *